United States Patent

Belkind et al.

[11] Patent Number: 5,338,422
[45] Date of Patent: Aug. 16, 1994

[54] DEVICE AND METHOD FOR DEPOSITING METAL OXIDE FILMS

[75] Inventors: Abraham I. Belkind, North Plain Field, N.J.; Leonard Wamboldt, Huntington, Mass.; Jesse D. Wolfe, San Ramon, Calif.

[73] Assignee: The BOC Group, Inc., Murray Hill, N.J.

[21] Appl. No.: 953,491

[22] Filed: Sep. 29, 1992

[51] Int. Cl.$^5$ .................................. C23C 14/34
[52] U.S. Cl. .................. 204/192.12; 204/298.12; 204/298.16; 204/298.19; 204/298.21; 204/298.22
[58] Field of Search ............... 204/298.21, 298.22, 204/298.12, 298.16, 298.19, 192.12

[56] References Cited

U.S. PATENT DOCUMENTS

| | | | |
|---|---|---|---|
| 4,417,968 | 11/1983 | McKelvey | 204/298.22 |
| 4,596,645 | 6/1986 | Stirn | 204/192 |
| 4,988,422 | 1/1991 | Wirz | 204/192.15 |
| 5,108,574 | 4/1992 | Kirs et al. | 204/298.21 |
| 5,215,638 | 6/1993 | Hausler | 204/192.12 |

OTHER PUBLICATIONS

Scherer and Wirz, "Reactive High Rate D.C. Sputtering of Oxides," *Thin Solid Films*, 119 (1984), pp. 203–209.

Maniv et al., "Transparent Conducting Zinc Oxide and Indium-Tin Oxide Films Prepared by Modified Reactive Planar Magnetron Sputtering," *J. Vac. Sci. Technol. A*, 1:3 (Jul.–Sep. 1983), pp. 1370–1375.

Westwood, William D., sections 9.5.3 and 9.5.4 of "Reactive Sputter Deposition," chapter 9 in *Handbook of Plasma Processing Technology*, eds. Rossnagel et al., Park Ridge, N.J.: Noyes Publications, 1990, pp. 249–256.

*Primary Examiner*—Asok Pal
*Attorney, Agent, or Firm*—David A. Draegert; Larry R. Cassett

[57] ABSTRACT

A triple magnetron array positioned inside a vacuum chamber is provided. The array includes a planar magnetron situated above dual rotatable unbalanced cylindrical magnetrons. The planar magnetron is partially shielded from the dual magnetrons by a baffle. An inert gas outlet is positioned near the planar magnetron target whereas oxygen gas outlets are positioned near the cylindrical magnetrons. In this fashion, the reactive gas flow to the planar magnetron is restricted. The system is particularly well suited for forming metal oxide films, such as titanium oxide, that are difficult to deposit by conventional means. The oxygen flow rate is controlled so that the planar magnetron operates in the metallic mode.

15 Claims, 2 Drawing Sheets

DEVICE AND METHOD FOR DEPOSITING METAL OXIDE FILMS

FIELD OF THE INVENTION

The invention relates generally to a device and method for depositing metal oxide films and more particularly to a reactive magnetron sputtering technique that employs a multiple target configuration for depositing such films on substrates.

BACKGROUND OF THE INVENTION

Sputtering is the physical ejection of material from a target as a result of ion bombardment of the target. The ions are usually created by collisions between gas atoms and electrons in a glow discharge. The ions are accelerated into the target cathode by an electric field. A substrate is placed in a suitable location so that it intercepts a portion of the ejected atoms. Thus, a coating is deposited on the surface of the substrate.

In an endeavor to attain increased deposition rates, magnetically enhanced targets have been used. In a planar magnetron, the cathode includes an array of permanent magnets arranged in a closed loop and mounted in a fixed position in relation to the flat target plate. Thus, the magnetic field is caused to travel in a closed loop, commonly referred to as a "race track", which establishes the path or region along which sputtering or erosion of the target material takes place. In a magnetron cathode, a magnetic field confines the glow discharge plasma and increases the length of the path of electrons moving under the influence of the electric field. This results in an increase in the gas atom-electron collision probability. This leads to a much higher sputtering rate than that which is obtained without the use of magnetic confinement. Further, the sputtering process can be accomplished at a much lower gas pressure.

Reactive sputtering techniques have been employed to form metal-oxide films. In reactive sputtering, a reactant gas forms a compound with the material which is sputtered from the target plate. When the target plate is a metal, and the reactive gas is oxygen, a metal oxide film is formed on the surface of the substrate.

With the advent of cylindrical magnetron, further improvements in reactive sputtering have been demonstrated. For instance, a method for depositing metal oxide films, particularly dielectric materials such as silicon dioxide, employs a rotatable cylindrical magnetron in DC reactive sputtering. See Wolfe et al., U.S. Pat. No. 5,047,131, issued Sept. 10, 1991. One advantage of rotatable cylindrical magnetrons is the self-cleaning effect which eliminates much of the arcing problem brought about by dielectric material buildup. However, even with cylindrical magnetrons, the reactive sputtering rates for some metal oxides, such as titanium oxide, are so low that reactive sputtering is prohibitively expensive.

Another means of enhancing reactive sputtering in magnetron systems is to modify the flux of reactant gas to the target relative to the flux to the substrate. In this regard, a baffle is positioned between the target and the substrate with the reactive and inert gas outlets strategically located within the vacuum chamber. See Wirz, U.S. Pat. No. 4,988,422, issued Jan. 29, 1991. While such modified magnetron systems have achieved some degree of success, problems remain. For instance, debris often accumulates along the edges of the baffle apertures which eventually falls onto the substrate. In addition, conventional baffle systems are difficult to scale-up to accommodate larger substrates. Finally, the reactive sputtering rates for many important metal oxides, including titanium oxide, remain low.

SUMMARY OF THE INVENTION

It is the object of the present invention to provide a technique for depositing metal oxide films at enhanced rates.

It is another object to provide a reactive sputtering device that can be readily scaled-up to accommodate large substrates.

Yet another object of the present invention is to provide a magnetron system employing multiple targets in which at least one of the targets operates in the metallic sputtering mode.

These and other objects are accomplished with the present invention which comprises a triple magnetron array positioned inside a vacuum chamber. The array includes a planar magnetron that is situated above dual rotatable cylindrical magnetrons. The planar magnetron is partially shielded from the dual magnetrons by a baffle. An inert gas outlet is positioned near the planar magnetron target whereas reactive gas outlets are positioned near the cylindrical magnetrons. In this fashion, the reactive gas flow to the planar magnetron is restricted.

This invention is particularly well suited for forming metal oxide films, such as titanium oxide, that are difficult to deposit by conventional means. When forming titanium oxide, all three magnetrons have titanium targets. In addition, means are employed to control the oxygen flow rate so that the planar magnetron operates in the metallic mode to sputter titanium onto the substrate. Moreover, the magnetic assembly in each cylindrical magnetron creates an unbalanced magnetic field which directs the plasma containing the activated oxygen species towards the substrate. This improves the rate at which oxygen reacts with the titanium atoms on the substrate surface to form titanium oxide.

DETAILED DESCRIPTION OF PREFERRED EMBODIMENTS

Figure 1:
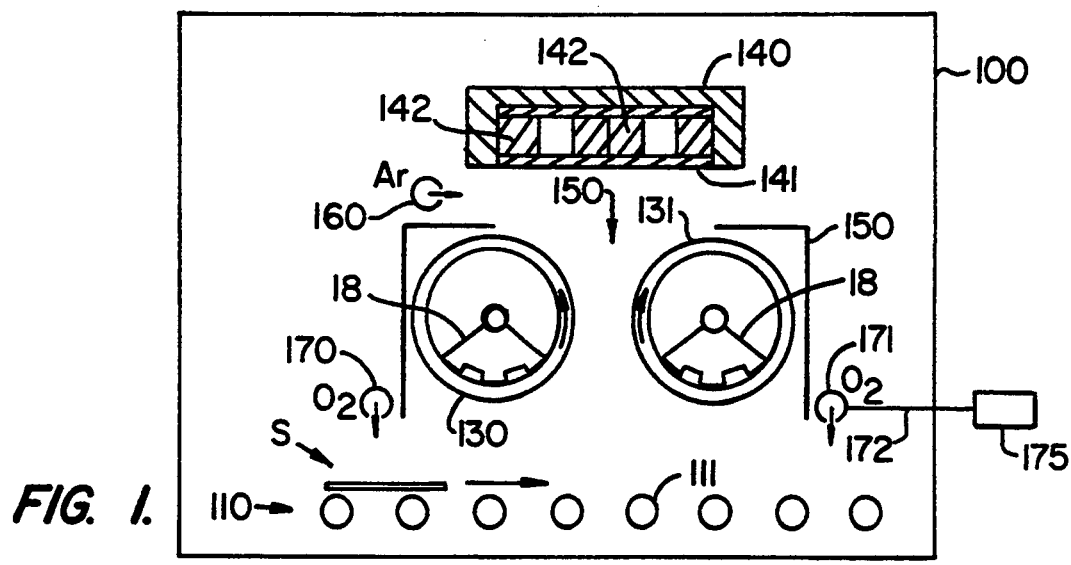
FIG. 1 is a cross-sectional view of a reactive sputtering system.

An embodiment of the inventive device is shown in FIG. 1 and comprises a modified ILS-1600 sputtering system, a C-MAG ® dual rotating cylindrical magnetron, and a HRC-373 planar magnetron, all of which are manufactured by Airco Coating Technology, a division of assignee. The ILS-1600 system comprises a vacuum chamber 100 and a conveyor system 110 with rollers 111 that are positioned near the bottom of the vacuum chamber for moving the substrates across the deposition zone during sputtering. The substrate can be made of any vacuum compatible material, such as metal, glass, and some plastics.

Figure 1A:
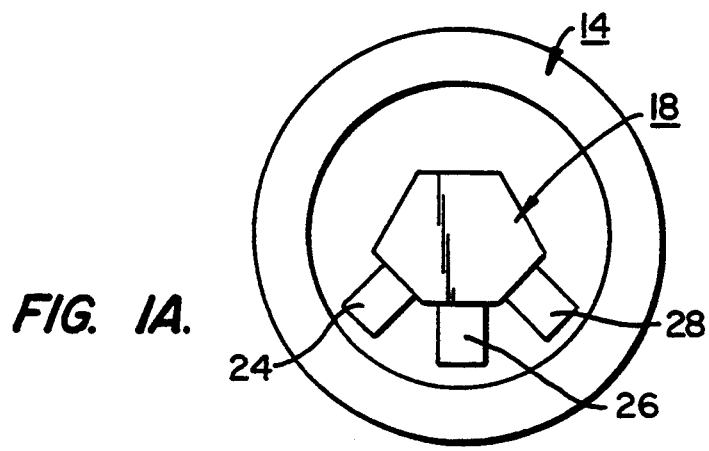
FIG. 1a is a cross-sectional view of a cylindrical magnetron.

The cylindrical targets 130 (C₁) and 131 (C₂) each generally comprises an elongated cylindrical titanium tube horizontally mounted in the vacuum chamber. An elongated magnet assembly 18 is carried within a lower portion of the tube, extends substantially its entire length, and is restrained against rotation with it. When sputtering materials other than titanium, it may be necessary to employ a support tube which is formed of suitable nonmagnetic material such as, for instance, brass or stainless steel, and is of a diameter, wall thickness, and length required for a particular operation to be performed. Applied to the outer surface of the tube is a layer of the target material to be sputtered. For a more detailed description of the cylindrical magnetrons, see Wolfe et al., U.S. Pat. No. 5,047,131, issued Sept. 10, 1991, which is incorporated herein. The magnet assembly is preferably such that the magnetic field of each cylindrical magnetron is unbalanced so that it will direct the plasma towards the substrate. In one preferred embodiment, as shown in FIG. 1a, wherein the magnetic field is unbalanced, the magnet assembly 18 comprises of an array of three magnet poles 24, 26, and 28 arranged in parallel rows along the lengths of tube 14. The unbalanced magnetic field is created when the strength of the magnetic field of center magnet 26 is not equal to twice the strength of either side magnet (24 or 28). The magnetic field strength of magnet 24 is usually the same as that of magnet 28.

Positioned above the dual cylindrical magnetrons is planar magnetron 140 with titanium target 141 and magnets 142 arranged behind the target. (Alternatively, a cylindrical magnetron can be used.) A baffle assembly 150, which comprises a grounded metal, e.g. stainless stain or aluminum, shroud encloses the cylindrical magnetrons; the baffle has an aperture 151 which has dimensions approximately equal to those of the titanium target of the planar magnetron. In this configuration, a substantial portion of the titanium sputtered from the planar magnetron will either be deposited directly onto the cylindrical magnetron surfaces or traverse through the gap between the cylindrical cathodes and be deposited on the substrate. Positioned above the baffle and on one side of the planar magnetron target is inert gas outlet 160. Argon is a preferred inert gas. Situated near the region between the conveyor means and the dual cylindrical target is reactive gas (oxygen) outlets 170 and 171. Each reactive gas outlet is connected via line 172 to an oxygen source (not shown). In addition, conventional means shown schematically as element 175 are provided to regulate the flow rate of oxygen into the chamber. Such means can include flow meters, valve systems, and flow controllers. In some processes, inert gas is mixed with oxygen to further enhance reactive sputtering.

The device and method according to the present invention provide metal oxide compound coatings which can be deposited at relatively high rates. To demonstrate the invention's effectiveness, titanium oxide ($TiO_2$) films were deposited on glass substrates. When employing conventional magnetron systems, $TiO_2$ is one of the slowest reactively sputtered materials. It is known that $TiO_2$ is the predominate form of titanium oxide created in the reactive sputtering process. However, it is believed that other forms are produced as well. Thus, unless otherwise stated, $TiO_2$ will represent all forms of titanium oxide produced by the invention.

Since the two cylindrical targets $C_1$ and $C_2$ have slightly different diameters, 250 W and 300 W were applied to the targets, respectively, to achieve the same deposition rate from each. The power applied to the planar target was 600 W. For each deposition the argon flow rate was 45 sccm and the total pressure of the vacuum chamber was approximately 2–4 mTorr. Depositions were made on a dynamic substrate with a conveyer speed of 50 in/min. Deposition process was characterized by the dynamic deposition rate, $D_{dyn}$, in $\text{\AA}mm^2/J$, as determined by the following formula:

$$D_{dyn} = (t \times 1 \times s)/(P \times n)$$

where t is the film thickness in Å, 1 is the racetrack length in mm, s is the conveyer speed in mm/s, P is the cathode power in watts, and n is the number of passes through the coat zone.

Figure 2:
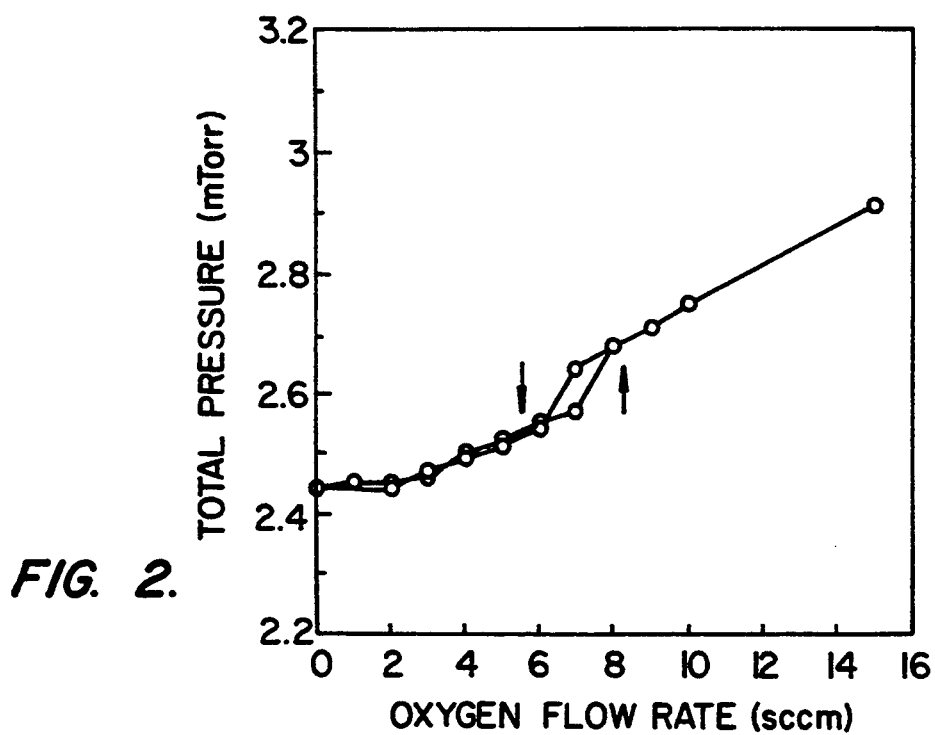
FIG. 2 is a graph of total pressure versus oxygen flow rate during reactive sputtering.
Figure 3:
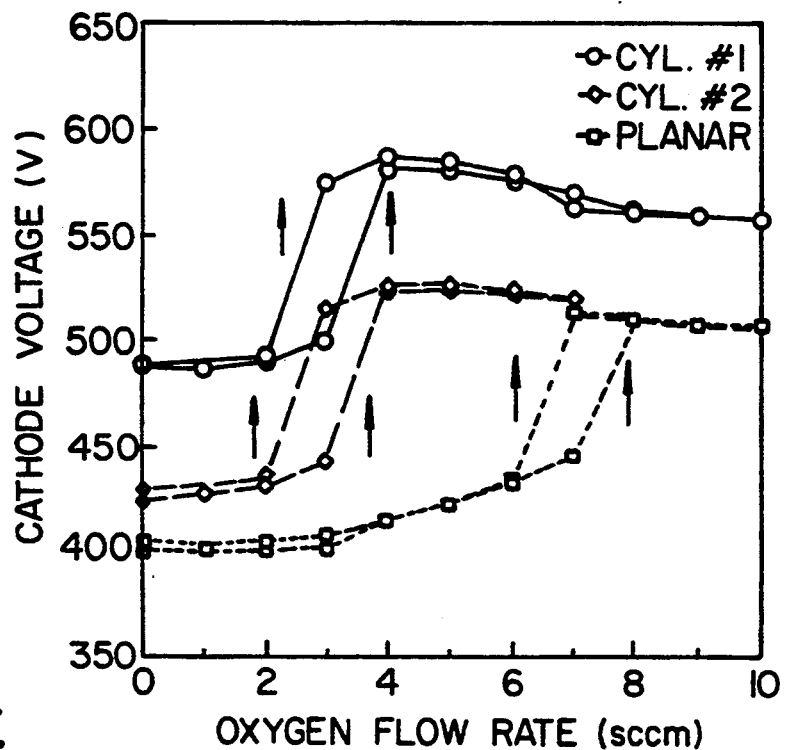
FIG. 3 is a/graph of cathode voltage versus oxygen flow rate during reactive sputtering.

The total pressure and voltages (of the three cathodes) versus the oxygen flow rate for the system were measured and the data are shown in FIGS. 2 and 3, respectively. As is apparent, the graphs describe the hysteresis effect representing the two regimes of operation, i.e., metallic cathode sputtering and compound-coated cathode sputtering, for the inventive device. See Handbook of Plasma Processing Technology, ed. by Rossnagel et al., Noyes Publication, 1990, Chapter 9 (pp. 233–259).

As shown in FIG. 3, when the oxygen flow rate ($F_{O2}$) is increased, a transition to the oxide mode first occurs at about $F_{O2} = \alpha$ sccm for both cylindrical cathodes. This transition to the oxide mode was not accompanied by a sharp increase in the total pressure (FIG. 2). Further increase of the oxygen flow rate to approximately 8 sccm resulted in the second transition to the oxide mode at the planar magnetron. The second transition is observed in both the total pressure (FIG. 2) and the cathode voltage (FIG. 3). Based on this information, one can conclude that by maintaining the oxygen flow rate between approximately 4 and 8 sccm, the planar magnetron will operate in the metallic mode while the cylindrical magnetrons will operate in the oxide mode. It is believed that the oxygen plasma present in the region near the cylindrical magnetrons provides oxygen species which react with the titanium that has been deposited on the substrate to form $TiO_2$ thereon. To assure that the system operate stably for long periods, it is preferred that the oxygen flow rate be no closer than 0.5 sccm of the transition points; that is, the flow rate should be between approximately 4.5 and 7.5 sccm.

Employing the device as shown in FIG. 1, three $TiO_2$ films were coated onto substrates under the operating parameters set forth in Table 1.

TABLE 1

| Sample No. | Flow Rate (sccm) | | Cathode Power (kW) | | | Target Mode | | | Thickness/pass (Å) | $D_{dyn}$ ($\text{\AA}mm^2/J$) | Refractive Index |
|---|---|---|---|---|---|---|---|---|---|---|---|
| | Ar | O₂ | C1 | C2 | P1 | C1 | C2 | P1 | | | |
| 1 | 45 | 5 | 0.25 | 0.3 | 0.0 | ox | ox | — | 33.2 | 102 | 2.46 |
| 2 | 45 | 8 | 0.25 | 0.3 | 0.6 | ox | ox | ox | 44.6 | 65.5 | 2.45 |

TABLE 1-continued

| Sample No. | Flow Rate (sccm) | | Cathode Power (kW) | | | Target Mode | | | Thickness/ pass (Å) | $D_{dyn}$ (Åmm²/J) | Refractive Index |
| --- | --- | --- | --- | --- | --- | --- | --- | --- | --- | --- | --- |
|  | Ar | O₂ | C1 | C2 | P1 | C1 | C2 | P1 |  |  |  |
| 3 | 45 | 4 | 0.25 | 0.3 | 0.6 | ox | ox | me | 145.0 | 213 | 2.42 |

In sample number 1, only the two cylindrical magnetrons operating in the oxide mode were used; no power was delivered to the planar magnetron. In sample number 2, all three magnetrons operated in the oxide mode, and, in sample 3, the planar magnetron operated in the metallic mode while the cylindrical magnetrons both operated in the oxide mode.

The difference in thickness between the TiO₂ film deposited in one pass for sample number 2 (44.6 Å) and for sample number 1 (33.2 Å) is 11.4 Å and this represents the contribution per pass made by the planar magnetron operating in the oxide mode. (Each pass refers to the crossing of the substrate through the plasma during the reactive sputtering process.) Based on the 11.4 Å/pass value, the dynamic deposition rate (DDR) for TiO₂ of the planar magnetron in this system operating alone in the oxide mode is calculated to be only 32.2 Åmm²/J. Such a low DDR relative to the dual cylindrical magnetrons (102 Åmm²/J) is due in part to the greater planar target-to-substrate distance and to the partial shielding by the dual cylindrical magnetrons of the deposition flux from the planar magnetron. As is apparent, there is a better than threefold increase in the DDR as demonstrated in sample 3 by operating the planar magnatron in the metallic mode. The refractive indices of the films produced apparently were not affected by the different operating parameters.

Figure 4:
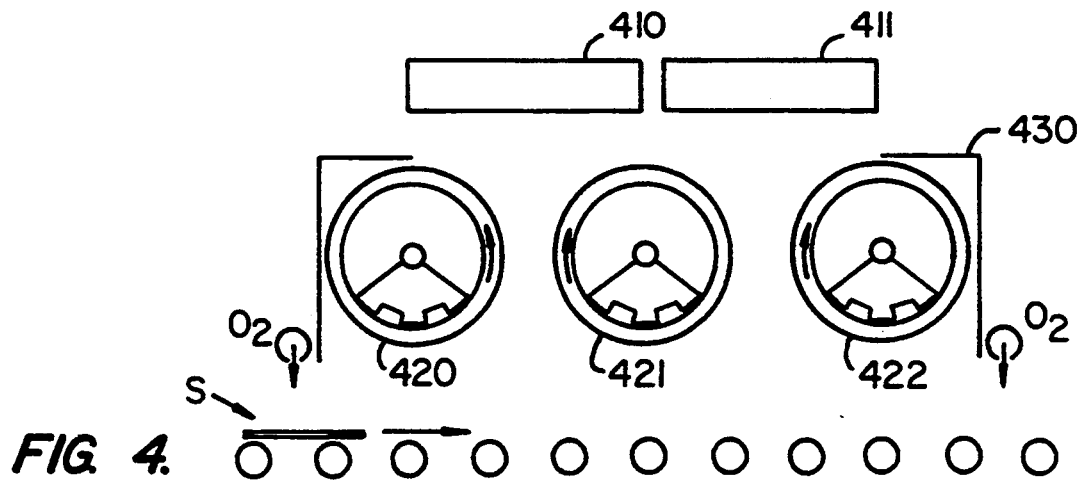
FIG. 4 is a cross-sectional view of a reactive sputtering system.

It is believed that the DDR for TiO₂ can be further improved by reducing the shielding effects of the cylindrical targets so that more of the titanium species sputtering off the planar magnetron reaches the substrate. This may be accomplished by positioning the dual magnetrons further apart. Moreover, it may be desirable to employ multiple magnetrons that operate in the metallic mode. For instance, in the embodiment as shown in FIG. 4, two planar magnetrons 410 and 411 operating in the metallic mode are positioned above three cylindrical magnetrons 420, 421, and 422 which operate in the oxide mode. Baffle 430 is positioned to restrict the flow of reactive gas to the planar targets.

The invention is not restricted to reactive sputtering TiO₂, but is applicable to the formation of metal oxides in general. Thus, any metal that can be used as target material in a magnetron can be employed. Common metals include aluminum, zinc, silicon, tin, tantalum, tungsten, zirconium, vanadium, chromium, bismuth, and niobium.

It is to be understood that while the invention has been described above in conjunction with preferred specific embodiments, the description and examples are intended to illustrate and not limit the scope of the invention, which is defined by the scope of the appended claims.

It is claimed:

1. A method of forming a thin film of metal oxide compound on a substrate within an evacuated chamber, said method comprising the steps of:

providing one or more first magentraons each having a metal sputtering material on an outer surface thereof;

positioning said substrate opposite said one or more first magentrons so that sputtered material from each magnetron is deposited onto said substrate;

causing an inert gas to flow into said vacuum chamber and to exit near said one or more first magnetrons;

providing one or more second magentrons each comprising of a rotatable cylindrical magnetron having a metal sputtering material on an outer surface thereof, wherein said one or more second magnetrons are positioned between said one or more first magnetrons and said substrate;

causing oxygen gas to flow into said vacuum chamber and to exit near said one or more second magnetrons wherein the flow rate of the oxygen is maintained at an effective rate to enable said one or more first magnetrons to sputter substantially in the metallic mode;

applying potential to said one or more first magnetrons to cause sputtering; and applying potential to said one or more second magnetrons.

2. The method as defined in claim 1 further comprising the step of positioning a baffle between said first magnetrons and said second magnetrons.

3. The method as defined in claim 1 wherein the step of providing one or more first magnetrons comprises of providing one or more planar magnetrons and wherein the step of providing one or more second magnetrons comprises of providing dual cylindrical magnetrons.

4. The method as defined in claim 3 wherein the step of providing one or more planar magnetrons comprises of providing one planar magnetron and wherein the method further comprises the step of positioning a baffle between said planar magnetron and said dual cylindrical magnetrons.

5. The method as defined in either claim 2 or 4 wherein the metal sputtering material comprises titanium.

6. The method as defined in either claim 2 or 4 wherein the metal sputtering material of said first and second magnetrons comprises of one or more metals selected from the group consisting of aluminum, zinc, silicon, tin, tantalu, tungsten, zirconium, vanadium, chromium, bismuth, and niobium.

7. The method as defined in either claim 2 or 4 further comprising the step of causing inert gas to flow into said vacuum chamber and to exit near said second magnetrons.

8. A device for forming a thin layer of metal oxide film on a substrate comprising of:

a vacuum chamber;

one or more first magnetrons situated inside said vacuum chamber each having a metal sputtering material on an outer surface thereof wherein said one or more magnetrons are positioned so that materials sputtered therefrom are deposited onto said substrate;

one or more inert as outlets situated near said one or more first magnetrons;

one or more second magnetrons each comprising of a rotatable cylindrical magnetron having a metal sputtering material on an outer surface thereof wherein each second magnetron is positioned inside said vacuum chamber and wherein each second magnetron is positioned between said one or more first magnetrons and said substrate;

one or more oxygen outlets situated near said one or more second magnetrons; and means for providing oxygen into said vacuum chamber at an effective flow rate to enable said one or more first magnetrons to operate substantially in the metallic mode.

9. The device as defined in claim 8 further comprising of baffle means for restricting oxygen flow from said one or more oxygen outlets to said first magnetrons.

10. The device as defined in claim 9 wherein said one or more first magnetrons comprise one or more planar magnetrons and wherein said one or more second magnetrons comprise dual cylindrical magnetrons.

11. The device as defined in claim 10 wherein said metal sputtering material comprises titanium.

12. The device as defined in claim 10 wherein said metal sputtering material comprises of one or more metals selected from the group consisting of aluminum, zinc, silicon, tin, tantalum, tungsten, zirconium, vanadium, chromium, bismuth, and niobium.

13. The device as defined in claim 11 further comprising means for regulating oxygen flow into a region near said one or more second magnetrons.

14. The device as defined in claim 12 further comprising means for regulating oxygen flow into a region near said one or more second magnetrons.

15. The device as defined in claim 10 wherein said one or more first magnetrons comprises a planar magnetron.

* * * * *